US008222957B2

(12) United States Patent
Kato

(10) Patent No.: US 8,222,957 B2
(45) Date of Patent: Jul. 17, 2012

(54) DIFFERENTIAL AMPLIFIER CIRCUIT, DISPLAY PANEL DRIVER, AND DISPLAY DEVICE

(75) Inventor: Fumihiko Kato, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/038,163

(22) Filed: Mar. 1, 2011

(65) Prior Publication Data
US 2011/0216258 A1  Sep. 8, 2011

(30) Foreign Application Priority Data

Mar. 2, 2010 (JP) .................. 2010-045256

(51) Int. Cl.
*H03F 3/45* (2006.01)
(52) U.S. Cl. ............... 330/253; 330/255
(58) Field of Classification Search ........... 330/253, 330/255, 257, 260, 261
See application file for complete search history.

(56) References Cited

U.S. PATENT DOCUMENTS

| 7,508,265 B2* | 3/2009 | Lin | 330/255 |
| 7,705,679 B2* | 4/2010 | Adachi | 330/255 |
| 7,777,568 B2* | 8/2010 | Lim | 330/253 |

FOREIGN PATENT DOCUMENTS

JP   2001-156559 A   6/2001

* cited by examiner

*Primary Examiner* — Henry Choe
(74) *Attorney, Agent, or Firm* — Sughrue Mion, PLLC

(57) ABSTRACT

A differential amplifying circuit includes first and second differential transistor pairs, first and second constant current sources, first and second current mirror circuits and first and second output transistors. The differential amplifying circuit also includes a feedback circuit configured to perform feedback operations to the first and second current mirror circuits to restrain reduction of gate voltages of the output transistors. The constant current sources are configured to increase bias currents in response to reduction of the gate voltages of the output transistors.

10 Claims, 7 Drawing Sheets

DIFFERENTIAL AMPLIFIER CIRCUIT, DISPLAY PANEL DRIVER, AND DISPLAY DEVICE

INCORPORATION BY REFERENCE

This patent application claims a priority on convention based on Japanese Patent Application No. 2010-45256 filed on Mar. 2, 2010. The disclosure thereof is incorporated herein by reference.

TECHNICAL FIELD

The present invention relates to a display panel driver provided with a differential amplifier circuit, and a display device.

BACKGROUND ART

In recent years, a panel display apparatus such as a liquid crystal display apparatus has been developed to have a finer resolution and a larger screen size, and as a result of this, a source driver for driving the display panel is required to have a capability of driving a large capacitive load at a higher speed. Therefore, it is necessary to improve a slew rate of a differential amplifier circuit used in an output stage of the source driver.

On the other hand, in a market of a cellular phone and other portable equipment with a built-in panel display apparatus, a demand of low current consumption amount is increased in order to extend a battery drive period. Since several tens to several hundreds of differential amplifier circuits are used according to a size of a display panel in the source driver of the panel display apparatus, it is important to reduce a current consumption amount per a single differential amplifier circuit.

One technique for realizing a high slew rate is to increase a bias current to be supplied to a differential pair in the input stage of the differential amplifier circuit. If the bias current is increased, a mutual conductance gm of each transistor of the differential pair is increased so that the high slew rate can be realized. However, this technique is involved with a problem that the current consumption amount of the differential amplifier circuit is increased.

In order to realize the high slew rate while suppressing the increase of the current consumption amount, in one technique, the bias current to be supplied to the differential pair in the input stage is increased only when signal levels of an inversion input signal and a non-inversion input signal is altered. Such a differential amplifier circuit is disclosed in JP 2001-156559A (Patent Literature 1).

FIG. 6 is a circuit diagram showing a configuration of the differential amplifier circuit disclosed in JP 2001-156559A. The differential amplifier circuit shown in FIG. 6 includes a PMOS differential input section 1, an NMOS differential input section 2, current mirror circuits 3 and 4, a push-pull output stage 5, a PMOS sub current source 6 and an NMOS sub current source 7.

The PMOS differential input section 1 includes PMOS transistors M1, M2 and M3. The PMOS transistors M2 and M3 have their sources connected in common and configure a differential transistor pair. A gate of the PMOS transistor M2 is connected to an inversion input In⁻ and the gate of the PMOS transistor M3 is connected to a non-inversion input In⁺. The gate of the PMOS transistor M1 is supplied with a bias voltage Vb1 so as to supply a bias current to the PMOS transistors M2 and M3. Output signals of the PMOS differential input section 1 from the PMOS transistors M2 and M3 are supplied to the current mirror circuit 4.

Meanwhile, the NMOS differential input section 2 includes NMOS transistors M4, M5 and M6. The NMOS transistors M4 and M5 have their sources connected in common and configure a differential transistor pair. A gate of the NMOS transistor M4 is connected to the inversion input In⁻ and a gate of the NMOS transistor M5 is connected to the non-inversion input In⁺. The gate of the NMOS transistor M6 is supplied with a bias voltage Vb2 so as to supply bias current to the NMOS transistors M4 and M5. Output signals of the NMOS differential input section 2 from the NMOS transistors M4 and M5 are supplied to the current mirror circuit 3.

The current mirror circuit 3 includes PMOS transistors M7, M8, M9 and M10 in which the gates of the PMOS transistors M9 and M10 are supplied with a bias voltage Vb3. Meanwhile, the current mirror circuit 4 includes NMOS transistors M11, M12, M13 and M14 in which the gates of the NMOS transistors M11 and M12 are supplied with a bias voltage Vb4. The current mirror circuit 3 and the current mirror circuit 4 are connected via resistor elements R101 and R102. The resistor elements R101 and R102 may be replaced with MOS transistors and the like.

The push-pull output stage 5 includes a PMOS output transistor M15 and an NMOS output transistor M16, and is connected to an output terminal Vout. A gate of the PMOS output transistor M15 is connected to a connection node between the PMOS transistor M10 and one end of the resistor element R102. A gate of the NMOS output transistor M16 of the push-pull output stage 5 is connected to a connection point between the NMOS transistor M12 and the other end of the resistor element R102. In addition, a phase compensating capacitor C101 is connected between an output terminal Vout and a source of the PMOS transistor M10, and a phase compensating capacitor C2 is connected between the output terminal Vout and the source of the NMOS transistor M12.

The PMOS sub current source 6 includes a PMOS sub current source transistor M18 and the gate thereof is supplied with a gate voltage of the PMOS output transistor M15. The PMOS sub current source 6 is connected in parallel with the PMOS transistor M1 of the PMOS differential input section 1. Similarly, the NMOS sub current source 7 includes an NMOS sub current source transistor M19 and the gate thereof is supplied with a gate voltage of the NMOS output transistor M16 of the push-pull output stage 5. The NMOS sub current source 7 is connected in parallel with the NMOS transistor M6 of the NMOS differential input section 2.

In FIG. 6, a symbol CL denotes an external load connected to the output terminal Vout of the push-pull output stage 5, a symbol Vdd denotes a positive power source line, and a symbol Vss denotes a negative power source line.

The differential amplifier circuit shown in FIG. 6 operates as described below. That is, a high output slew rate is realized while suppressing an increase of the current consumption amount. Specifically, when an operation state is changed from a steady state to a state that the non-inversion input voltage Vin+ is higher in level than the inversion input voltage Vin−, the PMOS sub current source transistor M18 is turned on so that the PMOS sub current source 6 is operated. Thus, the bias current of the PMOS differential input section 1 is temporarily increased. Similarly, when an operation state is changed from a steady state to a state that the non-inversion input voltage Vin+ is lower in level than the inversion input voltage Vin−, the NMOS sub current source transistor M19 is turned on so that the NMOS sub current source 7 is operated. Thus, the bias current of the NMOS differential input section 2 is temporarily increased. In either case, when there is a change in the non-inversion input voltage Vin+ and the inversion input voltage Vin−, the bias current is temporarily increase to thereby realize a high slew rate. On the other hand, since the increase of the bias current is temporary, increase of the current consumption amount can be suppressed.

CITATION LIST

[Patent Literature 1]: JP 2001-156559A

SUMMARY OF THE INVENTION

However, even in the configuration of the differential amplifier circuit shown in FIG. 6, the problem of increasing the current consumption amount cannot be solved. This is because, when the current of the PMOS differential input section 1 or the NMOS differential input section 2 increases, it is necessary to feed a large current through the push-pull output stage 5 in order to secure a phase margin. As described above, when an operation state is changed from the steady state to the state that the non-inversion input voltage Vin⁺ is higher in level than the inversion input voltage Vin− or the state that the non-inversion input voltage Vin⁺ is lower in level than the inversion input voltage Vin⁻, the PMOS sub current source 6 or the NMOS sub current source 7 is turned on so that the bias current of the PMOS differential input section 1 or the NMOS differential input section 2 is increased. If the bias current of the PMOS differential input section 1 or the NMOS differential input section 2 is increased, the phase margin is lowered and the stability of the differential amplifier circuit is degraded. At this time, in order to avoid the differential amplifier circuit from deviating from a stable operation, it is necessary to feed a large current through the push-pull output stage 5 in advance, and therefore it is difficult to drive the differential amplifier circuit while reducing the current consumption amount. A stability of the differential amplifier circuit in FIG. 6 and a necessity of increasing the current to be fed through the push-pull output stage 5 will be considered.

FIGS. 7A and 7B are schematic diagrams showing a frequency characteristic of the differential amplifier circuit shown in FIG. 6 and represent an angular frequency characteristic of a voltage gain and an angular frequency characteristic of a phase delay. The frequency characteristic of the differential amplifier circuit can be represented by a first pole frequency $|\bullet_{p1}|$, a second pole frequency $|\bullet_{p2}|$ and a unity gain frequency $\bullet_u$. For example, regarding a relation between a voltage gain Adc and a phase delay of the differential amplifier circuit, the phase delay of 90° is caused before and after the first pole frequency $|\bullet_{p1}|$, and further the phase delay of 90° is also caused before and after the second pole frequency $|\bullet_{p2}|$. Since the differential amplifier circuit is more stable as the phase delay at the time of unity gain frequency $\bullet_u$ is smaller, it is necessary to reduce the phase delay as small as possible and to increase the phase margin as large as possible, when the differential amplifier circuit is designed. Here, the phase margin is a value obtained by subtracting a phase delay value from 180°.

The second pole frequency $|\bullet_{p2}|$ and the unity gain frequency $\bullet_u$, can be represented by Equation (1) as below:

$$|\bullet_{p2}|=g_{m6}/C_2 \quad (1)$$

$$u=g_{m1}/C_c \quad (2)$$

Here, gm1 is a mutual conductance gm of each of the PMOS transistors M2 and M3 and the NMOS transistors M4 and M5 in FIG. 6, and gm6 is a mutual conductance gm of each of the PMOS output transistor M15 and NMOS output transistor M16. Cc is a capacitance value of each of the phase compensating capacitors C101 and C102, and $C_2$ in Equation (1) is a capacitance value of the external load CL. The mutual conductance gm of a MOS transistor is proportional to a square root of a current value flowing through the MOS transistor.

Here, when either the operation state is changed from the steady state to the state that the non-inversion input voltage Vin+ is higher or lower in level than the inversion input voltage Vin−, the unity gain frequency $\bullet_u$ is made higher. Specifically, when the operation state is changed from the steady state to the state that the non-inversion input voltage Vin+ is higher or lower in level than the inversion input voltage Vin−, the bias current of the PMOS differential input section 1 or the NMOS differential input section 2 increases. Thus, the mutual conductance gm of each of the PMOS transistors M2 and M3 and the NMOS transistors M4 and M5 increases. Namely, $g_{m1}$ in Equation (2) increases. If $g_{m1}$ in Equation (2) increases, the unity gain frequency $\bullet_u$ becomes higher.

On the other hand, when the operation state is changed from the steady state to the state that the non-inversion input voltage Vin+ is higher or lower in level than the inversion input voltage Vin−, the second pole frequency $|\bullet_{p2}|$ becomes lower. First, when the operation state is changed from the steady state to the state that the non-inversion input voltage Vin+ is higher in level than the inversion input voltage Vin−, the current flowing through the PMOS transistor M2 increases so that a drain voltage of the NMOS transistor M13 is raised and further a drain voltage of the NMOS transistor M11 and gate voltages of the NMOS transistors M13 and M14 are raised. Thus, a gate voltage of the NMOS output transistor M16 is lowered and a current flowing through the NMOS output transistor M16 is reduced. On the other hand, when the operation state is changed from the steady state to the state that the non-inversion input voltage Vin+ is lower in level than the inversion input voltage Vin−, the current flowing through the NMOS transistor M4 increases so that a drain voltage of the PMOS transistor M7 is lowered and further a drain voltage of the PMOS transistor M9 and gate voltages of the PMOS transistors M7 and M8 are lowered. Thus, a gate voltage of the PMOS output transistor M15 is raised and a current flowing through the PMOS output transistor M15 is reduced. As described above, even if the operation state is changed from the steady state to the state that the non-inversion input voltage Vin+ is either higher or lower in level than the inversion input voltage Vin−, a current flowing through the PMOS output transistor M15 or the NMOS output transistor M16 is reduced, and therefore the mutual conductance gm of the PMOS output transistor M15 or the NMOS output transistor M16 is lowered. Consequently, as understood from Equation (1), the second pole frequency $|\bullet_{p2}|$ is lowered.

As described above, when the operation state is changed from the steady state to the state that the non-inversion input voltage Vin+ is either higher or lower in level than the inversion input voltage Vin−, the unity gain frequency $\bullet_u$, becomes higher and the second pole frequency $|\bullet_{p2}|$ becomes lower. Therefore, as understood from FIGS. 7A and 7B, the phase margin is reduced. In the differential amplifier circuit shown in FIG. 6 having such characteristics as described above, it is necessary to raise the second pole frequency $|\bullet_{p2}|$ higher in advance in order to prevent the degradation in stability, and therefore a current flowing through the push-pull output stage 5 cannot be reduced in the steady state.

In an aspect of the present invention, a differential amplifying circuit includes: a first differential transistor pair of PMOS transistors that have gates connected with a non-inversion input and an inversion input, respectively; a first constant current source section configured to supply a first bias current to the first differential transistor pair; a second differential transistor pair of NMOS transistors that have gates connected with the non-inversion input and the inversion input, respectively; a second constant current source section configured to supply a second bias current to the second differential transistor pair; a first current mirror circuit connected with the first differential transistor pair; a second current mirror circuit connected with the second differential transistor pair; a PMOS output transistor connected between a positive power supply line and an output terminal and having a gate connected with an output of the second current mirror circuit; an NMOS output transistor connected between a negative power supply line and the output terminal and having a gate connected with an output of the first current mirror circuit; and a feedback circuit configured to perform a feed-back operation to the first current mirror circuit to restrain reduction of the gate voltage of the NMOS output transistor, and perform a feed-back operation to the second current mirror circuit to restrain increase of the gate voltage of the PMOS output transistor. The first constant current source section is configured to increase the first bias current in response to reduction of a gate voltage of the PMOS output transistor, and the second constant current source section is configured to increase the second bias current in response to increase of a gate voltage of the NMOS output transistor.

In another aspect of the present invention, a display panel driver driving a display panel, and includes an output circuit comprises the above differential amplifying circuit.

In still another aspect of the present invention, a display apparatus includes: a display panel; and a diver including an output circuit configured to drive a data line of the display panel. The output circuit comprises the above differential amplifying circuit.

According to the present invention, it is possible to provide the differential amplifier circuit realizing a high slew rate while suppressing an increase of a current consumption amount.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF EMBODIMENTS

First Embodiment

Figure 1:
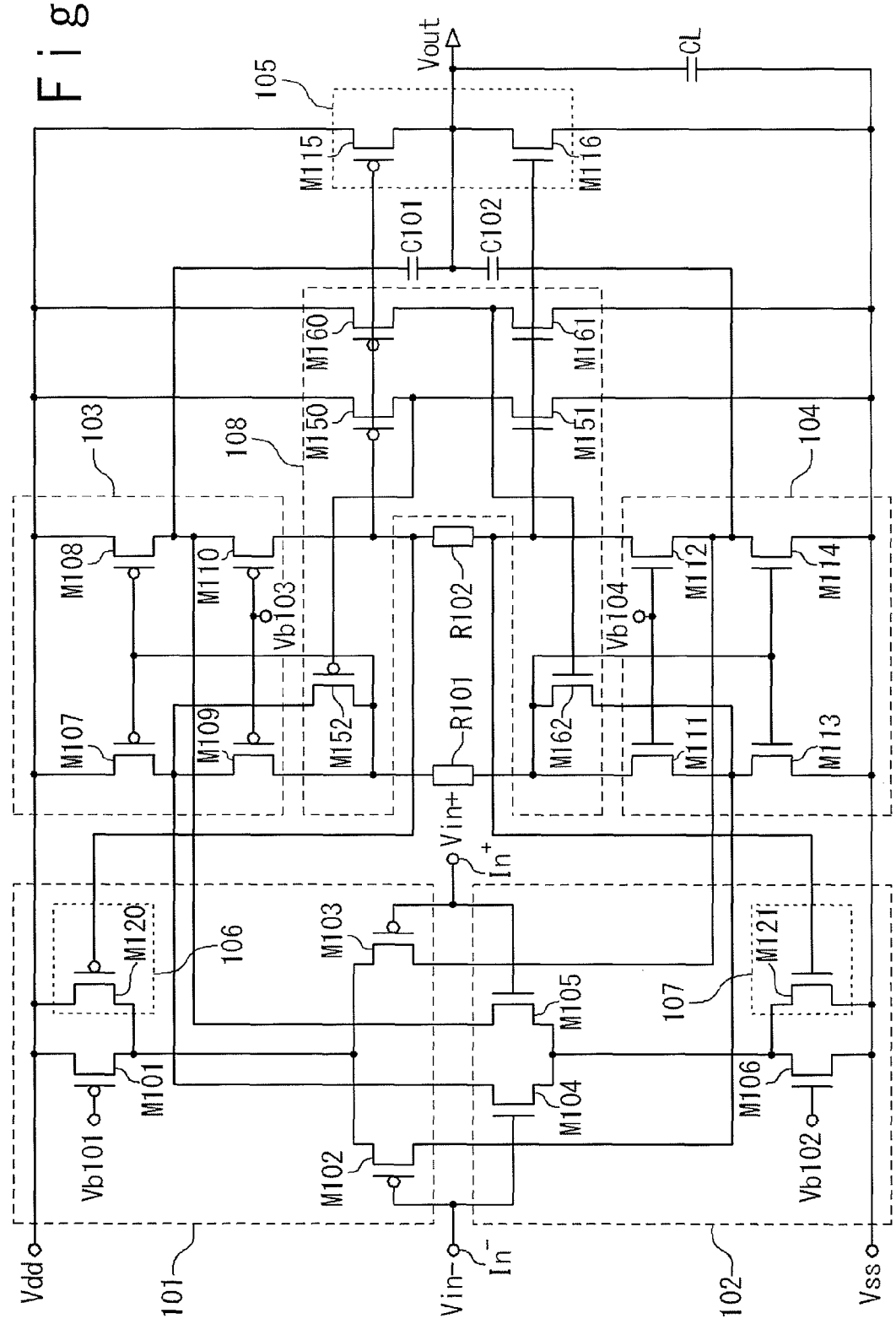
FIG. 1 is a circuit diagram showing a configuration of a differential amplifier circuit according to a first embodiment of the present invention.

FIG. 1 is a circuit diagram showing a configuration of a differential amplifier circuit according to a first embodiment of the present invention. The differential amplifier circuit shown in FIG. 1 includes a PMOS differential input section 101, an NMOS differential input section 102, current mirror circuits 103 and 104, resisters R101 and R102, a push-pull output stage 105, a PMOS sub current source 106, an NMOS sub current source 107 and a feedback circuit 108.

The PMOS differential input section 101 includes PMOS transistors M101, M102 and M103. The PMOS transistors M102 and M103 have their sources connected in common and configure a PMOS differential transistor pair. A gate of the PMOS transistor M102 is connected to a non-inversion input (In⁻) and a gate of the PMOS transistor M103 is connected to an inversion input (In⁺). A gate of the PMOS transistor M101 is connected to a bias terminal Vb101 and acts as a constant current source for supplying a bias current to the commonly connected sources of the PMOS transistors M102 and M103.

The NMOS differential input section 102 includes NMOS transistors M104, M105 and M106. The NMOS transistors M104 and M105 have their sources connected in common and configure an NMOS differential transistor pair. A gate of the NMOS transistor M104 is connected to a non-inversion input (In−) and the gate of the NMOS transistor M105 is connected to an inversion input (In+). A gate of the NMOS transistor M106 is connected to a bias terminal Vb102 and acts as a constant current source for deriving a bias current from the commonly connected sources of the NMOS transistors M104 and M105.

The current mirror circuit 103 includes PMOS transistors M107, M108, M109 and M110. Sources of the PMOS transistors M107 and M108 are connected in common to a positive power source line Vdd and gates thereof are connected in common to a drain of the PMOS transistor M109. Sources of the PMOS transistors M109 and M110 are respectively connected to drains of the PMOS transistors M107 and M108 and the gates thereof are connected in common to a bias terminal Vb103.

On the other hand, the current mirror circuit 104 includes NMOS transistors M111, M112, M113 and M114. Sources of the NMOS transistors M113 and M114 are connected in common to a negative power source line Vss and gates thereof are connected in common to a drain of the NMOS transistor M111. Sources of the NMOS transistors M111 and M112 are respectively connected to the drains of the NMOS transistors M113 and M114 and gates thereof are connected in common to a bias terminal Vb104.

The resistors R101 and R102 are connected between the current mirror circuits 103 and 104 and act as loads of the current mirror circuits 103 and 104. It is noted that a load (e.g., a floating current source) including a MOS transistor may be used instead of the resistors R101 and R102.

The push-pull output stage 105 includes a PMOS output transistor M115 and an NMOS output transistor M116. A source of the PMOS output transistor M115 is connected to the positive power source line Vdd and drain thereof is connected to an output terminal Vout. A source of the NMOS output transistor M116 is connected to the negative power source line Vss and drain thereof is connected to the output terminal Vout. A gate of the PMOS output transistor M115 is connected to a drain of the PMOS transistor M110 of the current mirror circuit 103 (i.e., one end of the resistor R102), and a gate of the NMOS output transistor M116 is connected to a drain of the NMOS transistor M112 of the current mirror circuit 104 (i.e., the other end of the resistor R102).

The PMOS sub current source 106 includes a PMOS sub current source transistor M120 that is connected in parallel to the PMOS transistor M101. A gate of the PMOS sub current source transistor M120 is connected to the gate of the PMOS output transistor M115 and a drain thereof is connected to the commonly connected sources of the PMOS transistors M102 and M103.

The NMOS sub current source 107 includes an NMOS sub current source transistor M121 that is connected in parallel to the NMOS transistor M106. A gate of the NMOS sub current source transistor M121 is connected to the gate of the NMOS output transistor M116 and a drain thereof is connected to the commonly connected sources of the NMOS transistors M104 and M105.

The feedback circuit 108 is configured to perform a feedback operation to the current mirror circuit 103 so as to fall a voltage of an output terminal of the current mirror circuit 103 (i.e., drain of the PMOS transistor M110) in response to rising of a gate voltage of the PMOS output transistor M115. Also, the feedback circuit 108 is configured to perform a feed-back operation to the current mirror circuit 103 so as to raise a voltage of an output terminal of the current mirror circuit 104 (i.e., drain of the NMOS transistor M112) in response to falling of a gate voltage of the NMOS output transistor M116.

More specifically, in the present invention, the feedback circuit 108 includes PMOS transistors M150, M160, M152 and NMOS transistors M151, M161 and M162. Gates of the PMOS transistor M150 and the NMOS transistor M151 are respectively connected to the gates of the PMOS output transistor M115 and the NMOS output transistor M116, and the drains thereof are connected in common. Gates of the PMOS transistor M160 and the NMOS transistor M161 are respectively connected to the gates of the PMOS output transistor M115 and the NMOS output transistor M116, and drains thereof are connected in common. A gate of the PMOS transistor M152 is connected to a commonly connected drain of the PMOS transistor M150 and the NMOS transistor M151, and drain thereof is connected to the drain of the PMOS transistor M109 in the current mirror circuit 103, and the source thereof is connected to the source of the PMOS transistor M109. Further, a gate of the NMOS transistor 162 is connected to the commonly connected drains of the PMOS transistor M160 and the NMOS transistor M161, and a drain thereof is connected to the drain of the NMOS transistor M111 in the current mirror circuit 104, and the source thereof is connected to a source of the NMOS transistor M111.

A phase compensating capacitor C101 is connected between the source of the PMOS transistor M110 in the current mirror circuit 103 and the output terminal Vout, and a phase compensating capacitor C102 is connected between the source of the NMOS transistor M112 in the current mirror circuit 104 and the output terminal Vout. An external load CL is connected to the output terminal Vout of the push-pull output stage 105.

In the differential amplifier circuit according to the present embodiment, when an operation state is changed from a steady state (i.e., a state that the non-inversion input voltage Vin+ is equal in level to the inversion input voltage Vin−) to a state that the non-inversion input voltage Vin+ is higher in level than the inversion input voltage Vin−, the PMOS sub current source transistor M120 is operated so that the bias current of the PMOS differential input section 101 is temporarily increased. Thus, a slew rate is effectively improved. At this time, the voltage of the commonly connected drains of the PMOS transistor M160 and the NMOS transistor M161 is raised and, in response thereto, the NMOS transistor M162 is turned on. Upon turning on the NMOS transistor M162, a short circuit is formed between the source and the drain of the NMOS transistor M111 so that gate voltages of the NMOS transistor M113 and the NMOS transistor M114 are prevented from rising. Thus, the falling of the gate voltage of the NMOS output transistor M116 is suppressed and the reduction in current of the NMOS output transistor M116 can be suppressed.

Meanwhile, when an operation state is changed from the steady state to a state that the non-inversion input voltage Vin+ is lower in level than the inversion input voltage Vin−, the NMOS sub current source transistor M121 is operated so that a bias current of the NMOS differential input section 102 is temporarily increased. Thus, the slew rate is effectively improved. At this time, the voltage of the commonly connected drains of the PMOS transistor M150 and the NMOS transistor M151 is raised so that the PMOS transistor M152 is turned on. Upon turning on the PMOS transistor M152, a short circuit occurs between the source and the drain of the PMOS transistor M109 so that gate voltages of the PMOS transistor M107 and the PMOS transistor M108 are prevented from lowering. Thus, the rising of the gate voltage of the NMOS output transistor M116 is suppressed and the reduction in current of the PMOS output transistor M115 can be suppressed.

According to the differential amplifier circuit shown in FIG. 1, in either case, the reduction in current flowing through the PMOS output transistor M115 and the NMOS output transistor M116 can be suppressed. This suppresses the reduction of the mutual conductance gm of each of the PMOS output transistor M115 and the NMOS output transistor M116, prevents the second pole frequency $|\bullet_{p2}|$ from lowering and is effective in increasing a phase margin. This eliminates the requirement of previously increasing the current of the push-pull output stage 105 and is effective to reduce a current consumption amount of the differential amplifier circuit. The fact that the phase margin can be increased by suppressing the reduction in current flowing through the PMOS output transistor M115 and the NMOS output transistor M116 will be described in detail below.

Figure 2A:
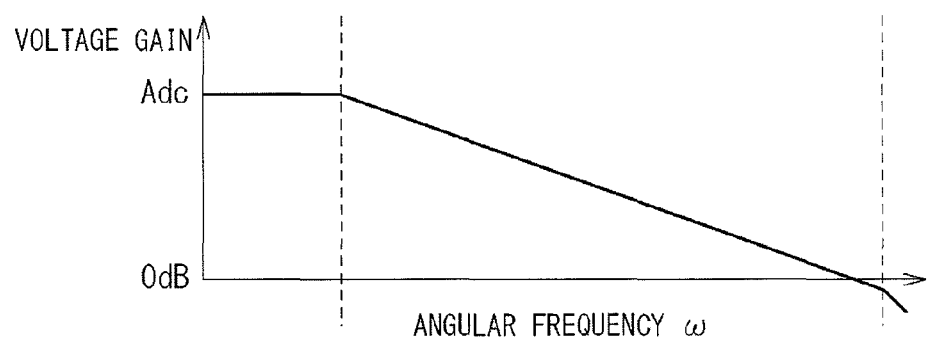
FIGS. 2A and 2B are graphs showing characteristics of the differential amplifier circuit according to the first embodiment.
Figure 2B:
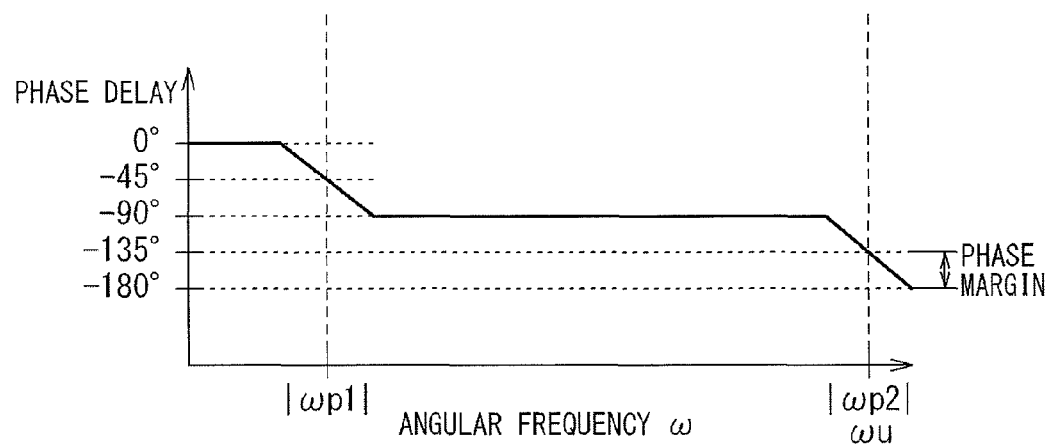

FIGS. 2A and 2B are graphs showing characteristics of a voltage gain and a phase delay with respect to angular frequency in the differential amplifier circuit shown in FIG. 1. As described above, the second pole frequency $|\bullet_{p2}|$ and the unity gain frequency $\bullet_u$ can be represented by Equations (1) and (2), respectively. Here, gm1 is equivalent to a mutual conductance gm of the PMOS transistor M102 or M103 or the NMOS transistor M104 or M105 shown in FIG. 1, and gm6 is equivalent to a mutual conductance gm of the PMOS output transistor M115 or the NMOS output transistor M116. Cc is equivalent to a capacitance of the phase compensating capacitor C101 or C102, and $C_2$ in Equation (1) is equivalent to a capacitance of the external load CL.

Figure 6:
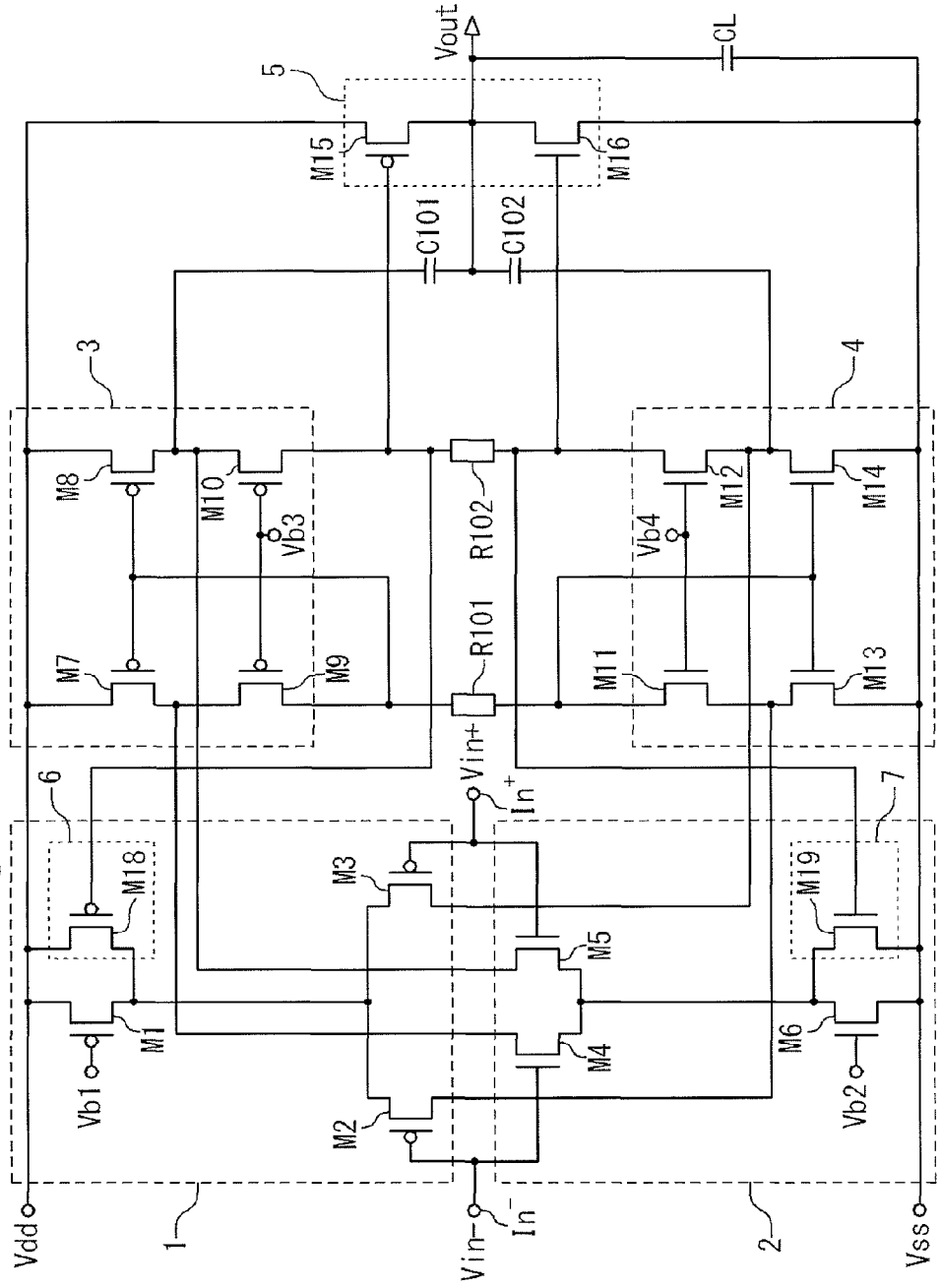
FIG. 6 is a circuit diagram showing a configuration of a conventional differential amplifier circuit.
Figure 7A:
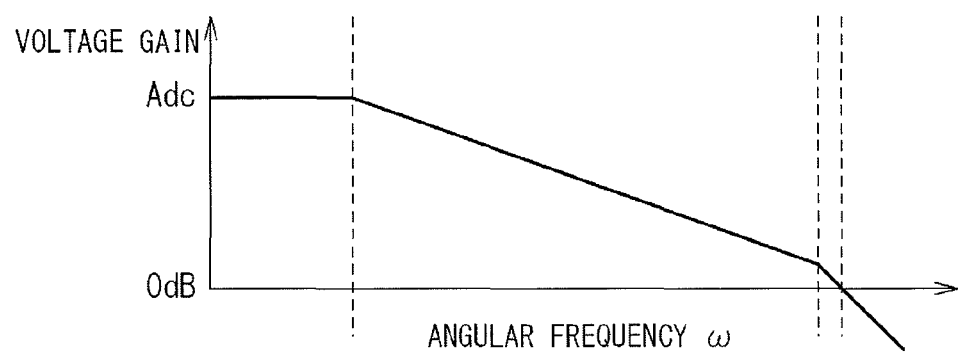
FIGS. 7A and 7B are graphs showing characteristics of the conventional differential amplifier circuit.
Figure 7B:
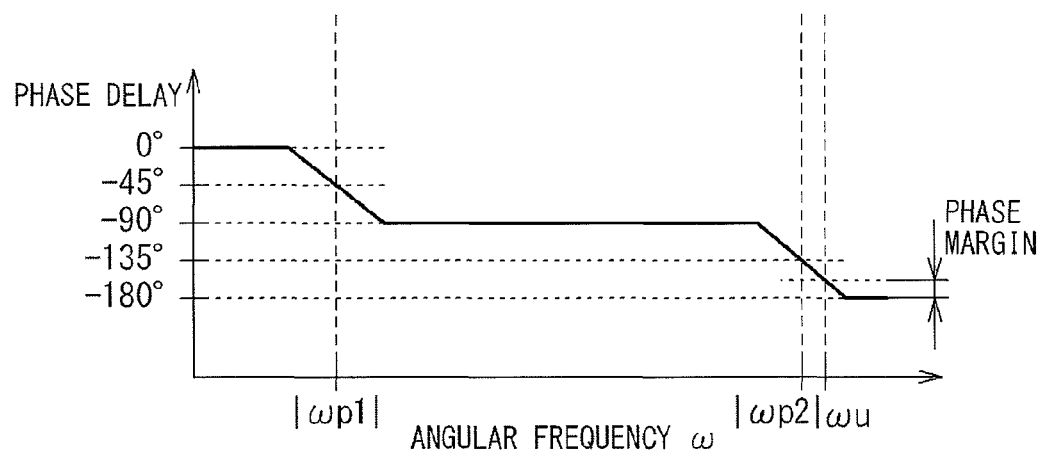

In the present embodiment, even when an operation state is changed to the state that the non-inversion input voltage Vin+ is higher in level than the inversion input voltage Vin−, the reduction in current flowing through the NMOS output transistor M116 can be suppressed, and also even when the operation state is changed to the state that the non-inversion input voltage Vin+ is lower in level than the inversion input voltage Vin−, the reduction in current flowing through the PMOS output transistor M115 can be suppressed. Therefore, the reduction of the mutual conductance gm of each of the PMOS output transistor M115 and the NNMOS output transistor M116, i.e., the reduction of gm6 in Equation (1) can be suppressed. Accordingly, when the operation state is changed from the steady state to the state that the non-inversion input voltage Vin+ is higher or lower in level than the inversion input voltage Vin−, the falling of the second pole frequency $|\bullet_{p2}|$ can be suppressed. As could be understood from a comparison of FIGS. 2A and 2B and FIG. 6, if the falling of the second pole frequency $|\bullet_{p2}|$ can be suppressed, the reduction of the phase margin can be suppressed. The suppression of the reduction of the phase margin eliminates the necessity of increasing the current of the push-pull output stage 105 in advance and is effective to reduce the current consumption amount of the differential amplifier circuit, as described above.

Herein, if a ratio of a gate width to a gate length (i.e., W/L) of each of the PMOS output transistor M115, the NMOS output transistor M116, the PMOS transistor M150, the NMOS transistor M151, the PMOS transistor 160 and the NMOS transistor M161 is selected to satisfy Equations (3) and (4) as shown below. In this case, the current flowing through the PMOS transistor M152 and the NMOS transistor M162 in the steady state can be made 0:

$$W/L_{(M115)}/W/L_{(M116)} < W/L_{(M150)}/W/L_{(M151)} \quad (3)$$

$$W/L_{(M115)}/W/L_{(M116)} > W/L_{(M160)}/W/L_{(M161)} \quad (4)$$

where $W/L_{(M115)}$, $W/L_{(M116)}$, $W/L_{(M150)}$, $W/L_{(M151)}$, $W/L_{(M160)}$ and $W/L_{(M161)}$ are ratios of the gate widths to gate lengths of the PMOS output transistor M115, the NMOS output transistor M116, the PMOS transistor M150, the NMOS transistor M151, the PMOS transistor 160 and the NMOS transistor M161, respectively. The selection of the W/L ratios to satisfy Equations (3) and (4) is effective to reduce the current consumption amount in the steady state.

Second Embodiment

Figure 3:
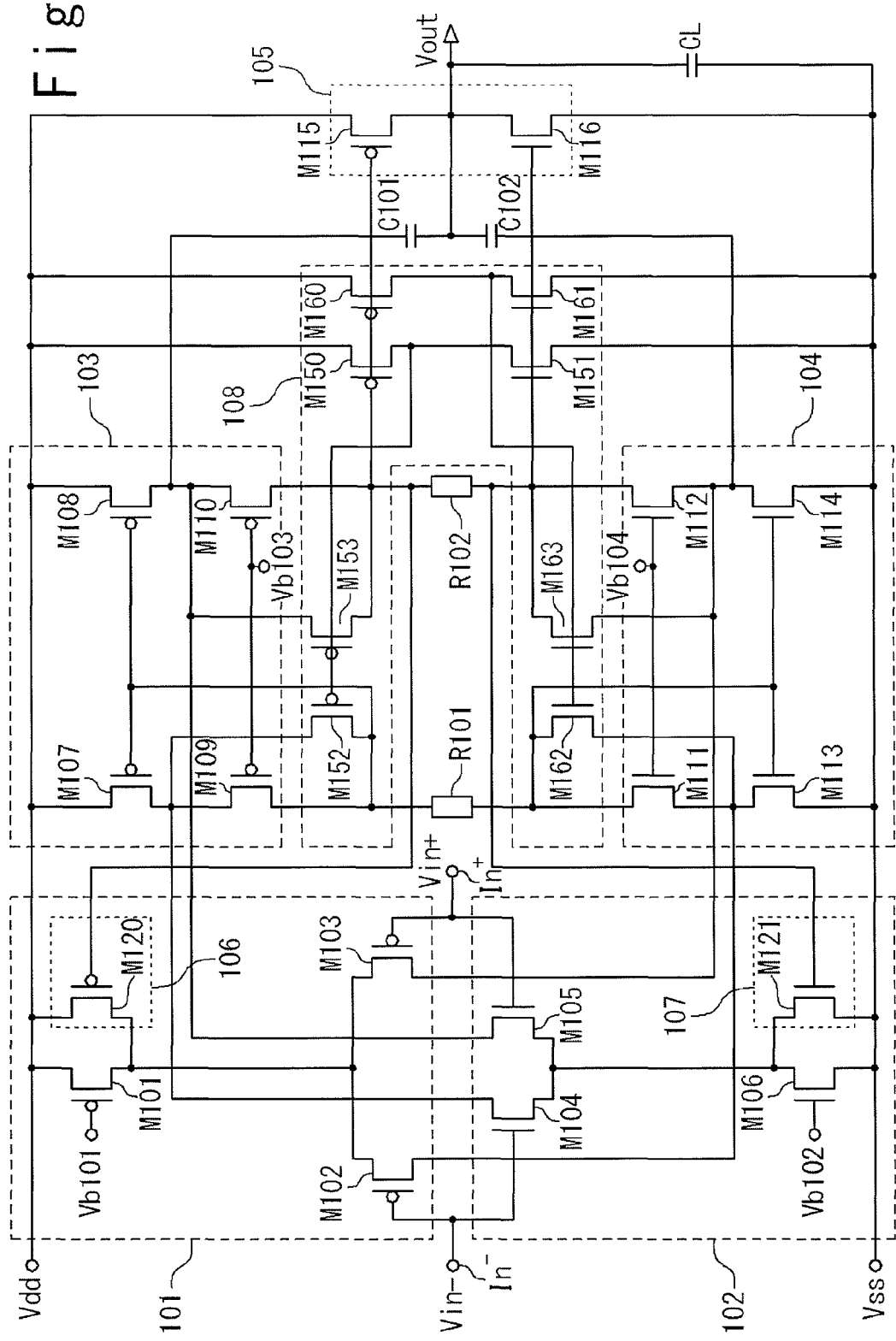
FIG. 3 is a circuit diagram showing a configuration of the differential amplifier circuit according to a second embodiment of the present invention.

FIG. 3 is a circuit diagram showing a configuration of the differential amplifier circuit according to a second embodiment of the present invention. The differential amplifier circuit of the second embodiment has a configuration of adding a PMOS transistor M153 and an NMOS transistor M163 to the feedback circuit 108 in the differential amplifier circuit of the first embodiment shown in FIG. 1. A gate of the PMOS transistor M153 is connected to the commonly connected drains of the PMOS transistor M150 and the NMOS transistor M151, and a drain thereof is connected to a drain of the PMOS transistor M110, and a source thereof is connected to a source of the PMOS transistor M110. A gate of the NMOS transistor M163 is connected to the commonly connected drains of the PMOS transistor M160 and the NMOS transistor M161, and a drain thereof is connected to the drain of a NMOS transistor M112, and the source thereof is connected to a source of the NMOS transistor M112.

The differential amplifier circuit of the second embodiment essentially performs the same operation as that of the first embodiment, and therefore there can be obtained an advantage of suppressing the reduction of the phase margin. This eliminates necessity of increasing a current of the push-pull output stage 105 in advance and is effective to reduce the current consumption amount of the differential amplifier circuit.

In addition, according to the second embodiment, since the connections of the MOS transistors to the current mirror circuits 103 and 104 are symmetric, the current mirror characteristics are improved, to thereby obtain an output of the differential amplifier circuit with a small offset.

Third Embodiment

Figure 4:
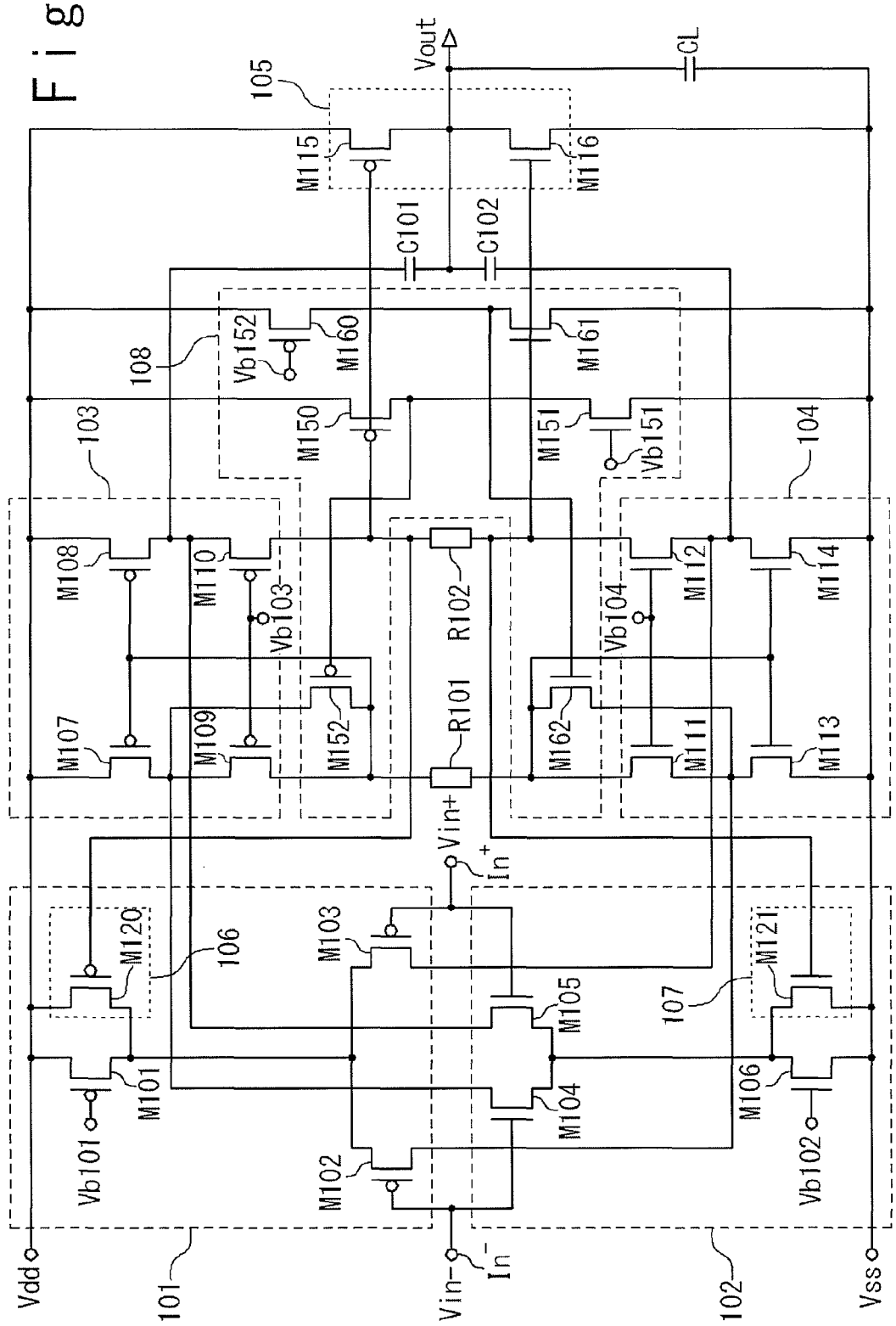
FIG. 4 is a circuit diagram showing a configuration of the differential amplifier circuit according to a third embodiment of the present invention.

FIG. 4 is a circuit diagram showing a configuration of the differential amplifier circuit according to a third embodiment of the present invention. In the differential amplifier circuit of the third embodiment, the configuration of the feedback circuit 108 is modified from those of the first and second embodiments. Specifically, a gate of the NMOS transistor M151 is connected a bias terminal Vb151 instead of a gate of the NMON output transistor M116. A predetermined bias voltage is supplied to the gate of the NMOS transistor M151 through the bias terminal Vb151. Similarly, a gate of the PMOS transistor M160 is connected a bias terminal Vb152 instead of the gate of the PMON output transistor M115. A predetermined bias voltage is supplied to the gate of the PMOS transistor M160 through the bias terminal Vb152. In this case, the NMOS transistor M151 merely acts as a load connected between the PMOS transistor M150 and the negative power source line Vss, and also the PMOS transistor M160 merely acts as a load connected between the NMOS transistor M161 and the positive power source line Vdd.

However, the operation of the differential amplifier circuit in the third embodiment is essentially the same as those of the first and second embodiments, and there can be obtained an advantage of suppressing the reduction of the phase margin. This eliminates necessity of increasing a current flowing through the push-pull output stage 105 in advance and is effective to reduce the current consumption of the differential amplifier circuit.

In addition, in the third embodiment, since the MOS transistors connected to the gates of the PMOS output transistor M115 and the NMOS output transistor M116 are reduced, parasitic capacitances of wirings connected to the corresponding gates are reduced, to thereby obtain a higher response speed. Also, in the differential amplifier circuit of the third embodiment, it may be possible to adopt a configuration that the feedback circuit 108 is additionally provided with the PMOS transistor M153 and the NMOS transistor M163 similarly to that of the second embodiment.

[Preferable Application of Differential Amplifier Circuit]

Figure 5:
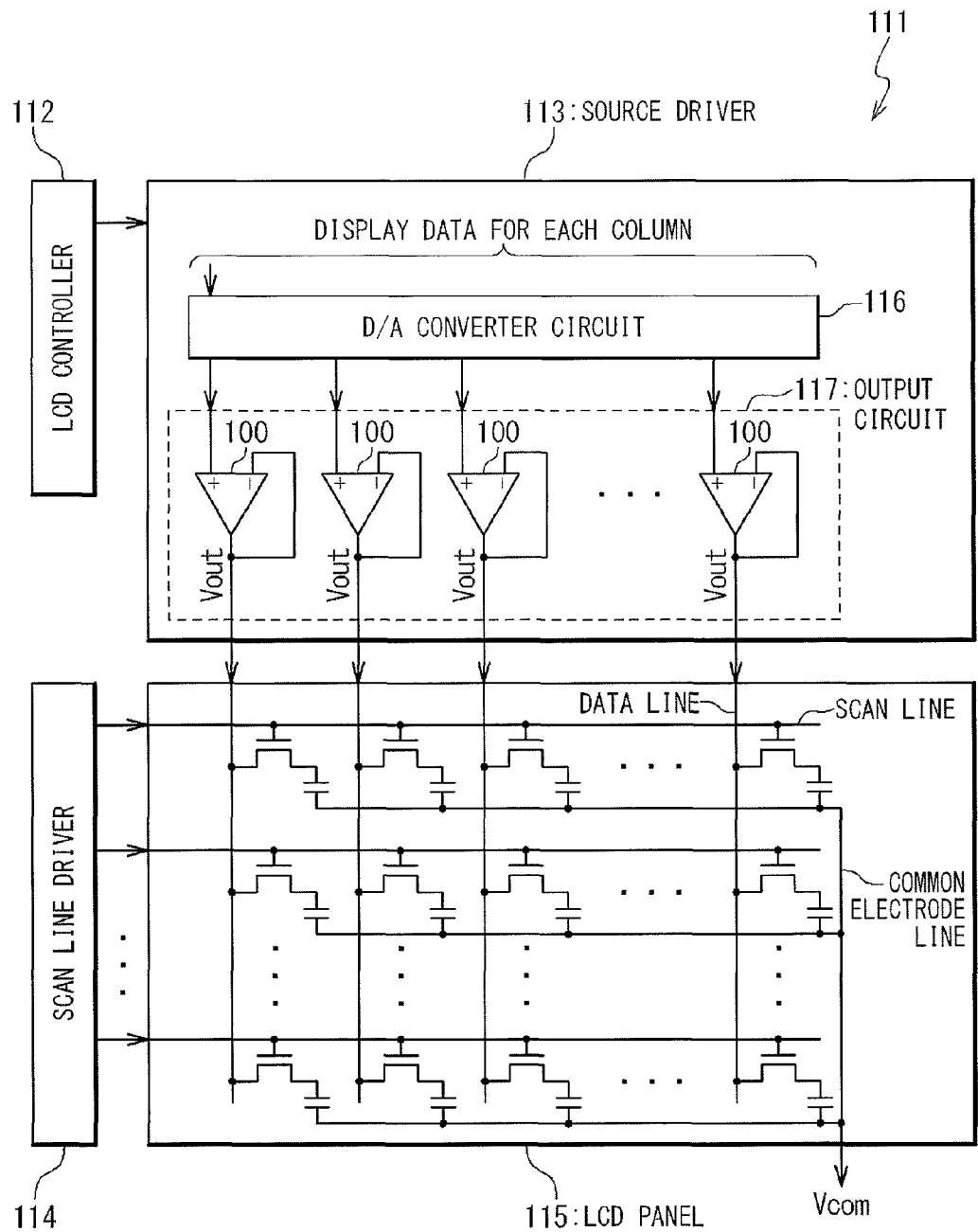
FIG. 5 is a block diagram showing a configuration of a liquid crystal display device incorporating the differential amplifier circuit according to the present invention.

Each of the differential amplifier circuits described above is suitable for an output amplifier in a source driver for driving data lines of an LCD (liquid crystal display) panel in a liquid crystal display apparatus. FIG. 5 is a block diagram schematically showing a configuration of a liquid crystal display apparatus 111 in which the differential amplifier circuit mentioned above is applied to the source driver. The liquid crystal display apparatus 111 includes an LCD controller 112, a source driver 113, a scanning line driver 114 and an LCD panel 115. The LCD panel 115 is provided with pixels at respective intersecting positions of the data lines and the scanning lines. The LCD controller 112 supplies display data to the source driver 113 to specify a gradation of each pixel of the LCD panel 115. The source driver 113 drives data lines (signal lines) of the LCD panel 115 in response to the display data. The scanning line driver 114 drives scanning lines of the LCD panel 115. Thus, the LCD panel 115 displays an image corresponding to the display data.

The source driver 113 includes a D/A converter circuit 116 and an output circuit 117. D/A converter circuit 116 outputs a gradation voltage corresponding to the display data. The output circuit 117 includes the differential amplifier circuits 100 mentioned above. Each of the differential amplifier circuits 100 may be have any of the configurations shown in FIGS. 1, 3 and 4. An output terminal of each of the differential amplifier circuits 100 is connected to one of the input terminals (e.g., an inversion input terminal In−) and acts as a voltage follower. Each of the differential amplifier circuits 100 outputs a driving voltage corresponding to a gradation voltage received from the D/A converter circuit 116 to a corresponding data line. Thus, each of the pixels in the LCD panel 115 is driven. Here, although the explanation is referred to a liquid crystal display device in which each of the differential amplifier circuits 100 is applied to a source driver for driving a LCD panel, it will be self-evident for those skilled in the art that the present invention can be applied to a display panel driver for driving data lines of another different display panel acting as a capacitive load.

What is claimed is:

1. A differential amplifying circuit comprising:
   a first differential transistor pair of PMOS transistors that have gates connected with a non-inversion input and an inversion input, respectively;
   a first constant current source section configured to supply a first bias current to said first differential transistor pair;
   a second differential transistor pair of NMOS transistors that have gates connected with said non-inversion input and said inversion input, respectively;
   a second constant current source section configured to supply a second bias current to said second differential transistor pair;
   a first current mirror circuit connected with said first differential transistor pair;
   a second current mirror circuit connected with said second differential transistor pair;
   a PMOS output transistor connected between a positive power supply line and an output terminal and having a gate connected with an output of said second current mirror circuit;
   an NMOS output transistor connected between a negative power supply line and said output terminal and having a gate connected with an output of said first current mirror circuit; and
   a feedback circuit configured to perform a feed-back operation to said first current mirror circuit to restrain reduction of the gate voltage of said NMOS output transistor, and perform a feed-back operation to said second current mirror circuit to restrain increase of the gate voltage of said PMOS output transistor,
   wherein said first constant current source section is configured to increase said first bias current in response to reduction of a gate voltage of said PMOS output transistor, and said second constant current source section is configured to increase said second bias current in response to increase of a gate voltage of said NMOS output transistor.

2. The differential amplifying circuit according to claim 1, wherein said second current mirror circuit comprises:
   first and second PMOS transistors having sources connected to said positive power supply line and gates connected to each other, respectively; and
   third and fourth PMOS transistors having sources connected to drains of said first and second PMOS transistors and gates connected to each other, respectively,
   wherein the gates of said first and second PMOS transistors are connected with a drain of said third PMOS transistor,
   wherein drains of said NMOS transistors of said second differential transistor pair are connected with drains of said first and second PMOS transistors, respectively,
   wherein a drain of said fourth PMOS transistor is connected with the gate of said PMOS output transistor, and wherein said feedback circuit comprises:
   a fifth PMOS transistor having a gate connected with the gate of said PMOS output transistor and a source connected with said positive power supply line; and
   a sixth PMOS transistor having a gate connected with a drain of said fifth PMOS transistor, a source connected with the source of said third PMOS transistor and a drain connected with the drain of said third PMOS transistor.

3. The differential amplifying circuit according to claim 1, wherein said first current mirror circuit comprises:
   first and second NMOS transistors having sources connected to said negative power supply line and gates connected to each other, respectively; and
   third and fourth NMOS transistors having sources connected with drains of said first and second NMOS transistors and gates connected to each other, respectively,
   wherein the gates of said first and second NMOS transistors are connected with a drain of said third NMOS transistor,
   wherein drains of said PMOS transistors of said first differential transistor pair are connected with the drains of said first and second NMOS transistors, respectively,
   wherein a drain of said fourth NMOS transistor is connected with the gate of said NMOS output transistor, and wherein said feedback circuit comprises:
   a fifth NMOS transistor having a gate connected with the gate of said NMOS output transistor and a source connected with said negative power supply line; and
   a sixth NMOS transistor having a gate connected with a drain of said fifth NMOS transistor, a source connected with the source of said third NMOS transistor and a drain connected with the drain of said third NMOS transistor.

4. The differential amplifying circuit according to claim 2, wherein said feedback circuit further comprises:
   a seventh PMOS transistor having a gate connected with a drain of said fifth PMOS transistor, a source connected with the source of said fourth PMOS transistor and a drain connected with a drain of said fourth PMOS transistor.

5. The differential amplifying circuit according to claim 3, wherein said feedback circuit further comprises:
   a seventh NMOS transistor having a gate connected with the drain of said fifth NMOS transistor, a source connected with the source of said fourth NMOS transistor and a drain connected with the drain of said fourth NMOS transistor.

6. The differential amplifying circuit according to claim 2, wherein said feedback circuit further comprises:
   an eighth NMOS transistor having a gate supplied with a fixed electrode bias, a drain connected with a drain of said fifth PMOS transistor and a source connected with said negative power supply line.

7. The differential amplifying circuit according to claim 3, wherein said feedback circuit further comprises:
   an eighth PMOS transistor having a gate supplied with a fixed bias, a drain connected with a drain of said fifth NMOS transistor and a source connected with said positive power supply line.

8. The differential amplifying circuit according to claim 1, wherein said first current mirror circuit comprises:
   first and second NMOS transistors having sources connected with said negative power supply line and gates connected with each other, respectively; and
   third and fourth NMOS transistors having gates connected with each other and sources connected with the drains of said first and second NMOS transistors, respectively, wherein the gates of said first and second NMOS transistors are connected with a drain of said third NMOS transistor,
wherein drains of said PMOS transistors of said first differential transistor pair are connected with the drains of said first and second NMOS transistors, respectively,
wherein drain of said fourth NMOS transistor is connected with the gate of said NMOS output transistor,
wherein said second current mirror circuit comprises:
first and second PMOS transistors having sources connected with said positive power supply line and gates connected with each other, respectively; and
third and fourth PMOS transistors having sources connected with drains of said first and second PMOS transistors, and gates connected with each other, respectively,
wherein the gates of said first and second PMOS transistors are connected with a drain of said third PMOS transistor,
wherein drains of said NMOS transistors of said second differential transistor pair are connected with the drains of said first and second PMOS transistors,
wherein a drain of said fourth PMOS transistor is connected with the gate of said PMOS output transistor,
wherein said feedback circuit comprises:
a fifth PMOS transistor having a gate connected with the gate of said PMOS output transistor and a source connected with said positive power supply line;
a sixth PMOS transistor having a gate connected with the drain of said fifth PMOS transistor, a source connected with a source of said third PMOS transistor and a drain connected with the drain of said third PMOS transistor;
an eighth PMOS transistor having a gate connected with said PMOS output transistor, and a source connected with said positive power supply line;
a fifth NMOS transistor having a gate connected with the gate of said NMOS output transistor and a source connected with said negative power supply line;
a sixth NMOS transistor having a gate connected with a drain of said fifth NMOS transistor, a source connected with the source of said third NMOS transistor and a drain connected with the drain of said third NMOS transistor; and
an eighth NMOS transistor having a gate connected with the gate of said NMOS output transistor, a source connected with said negative power supply line, and a drain connected with the drain of said fifth PMOS transistor; and
wherein a ratio of a gate width to a gate length in said PMOS output transistor $W/L_{(M115)}$, a ratio of a gate width to a gate length in said NMOS output transistor $W/L_{(M116)}$, a ratio of a gate width to a gate length in said fifth PMOS transistor $W/L_{(M150)}$, and a ratio of a gate width to a gate length in said eighth NMOS transistor $W/L_{(M51)}$, a ratio of a gate width to a gate length in said eighth PMOS transistor $W/L_{(M160)}$ and a ratio of a gate width to a gate length in said fifth NMOS transistor $W/L_{(M161)}$ satisfy the following equations:

$$W/L_{(M115)}/W/L_{(M116)} < W/L_{(M150)}/W/L_{(M151)},$$

$$W/L_{(M115)}/W/L_{(M116)} > W/L_{(M160)}/W/L_{(M161)}.$$

9. A display panel driver which drives a display panel, comprising: an output circuit which comprises a differential amplifying circuit,
wherein said differential amplifying circuit comprises:

a first differential transistor pair of PMOS transistors that have gates connected with a non-inversion input and an inversion input, respectively;
a first constant current source section configured to supply a first bias current to said first differential transistor pair;
a second differential transistor pair of NMOS transistors that have gates connected with said non-inversion input and said inversion input, respectively;
a second constant current source section configured to supply a second bias current to said second differential transistor pair;
a first current mirror circuit connected with said first differential transistor pair;
a second current mirror circuit connected with said second differential transistor pair;
a PMOS output transistor connected between a positive power supply line and an output terminal and having a gate connected with an output of said second current mirror circuit;
an NMOS output transistor connected between a negative power supply line and said output terminal and having a gate connected with an output of said first current mirror circuit; and
a feedback circuit configured to perform a feed-back operation to said first current mirror circuit to restrain reduction of the gate voltage of said NMOS output transistor, and perform a feed-back operation to said second current mirror circuit to restrain increase of the gate voltage of said PMOS output transistor, and
wherein said first constant current source section is configured to increase said first bias current in response to reduction of a gate voltage of said PMOS output transistor, and said second constant current source section is configured to increase said second bias current in response to increase of a gate voltage of said NMOS output transistor.

10. A display apparatus comprising:
a display panel; and
a diver comprising an output circuit configured to drive a data line of said display panel,
wherein said output circuit comprises a differential amplifying circuit which comprises:
a first differential transistor pair of PMOS transistors that have gates connected with a non-inversion input and an inversion input, respectively;
a first constant current source section configured to supply a first bias current to said first differential transistor pair;
a second differential transistor pair of NMOS transistors that have gates connected with said non-inversion input and said inversion input, respectively;
a second constant current source section configured to supply a second bias current to said second differential transistor pair;
a first current mirror circuit connected with said first differential transistor pair;
a second current mirror circuit connected with said second differential transistor pair;
a PMOS output transistor connected between a positive power supply line and an output terminal and having a gate connected with an output of said second current mirror circuit;
an NMOS output transistor connected between a negative power supply line and said output terminal and having a gate connected with an output of said first current mirror circuit; and
a feedback circuit configured to perform a feed-back operation to said first current mirror circuit to restrain reduction of the gate voltage of said NMOS output transistor, and perform a feed-back operation to said second current mirror circuit to restrain increase of the gate voltage of said PMOS output transistor, and wherein said first constant current source section is configured to increase said first bias current in response to reduction of a gate voltage of said PMOS output transistor, and said second constant current source section is configured to increase said second bias current in response to increase of a gate voltage of said NMOS output transistor.

* * * * *

UNITED STATES PATENT AND TRADEMARK OFFICE
CERTIFICATE OF CORRECTION

PATENT NO.        : 8,222,957 B2
APPLICATION NO.   : 13/038163
DATED             : July 17, 2012
INVENTOR(S)       : Fumihiko Kato Page 1 of 1

It is certified that error appears in the above-identified patent and that said Letters Patent is hereby corrected as shown below:

In the Specifications

Column 5, Line 32: Delete "diver" and insert -- driver --

Column 8, Line 66: Delete "NNMOS" and insert -- NMOS --

Column 10, Line 13: Delete "NMON" and insert -- NMOS --

Column 10, Line 17: Delete "PMON" and insert -- PMOS --

In the Claims

Column 13, Line 55: In Claim 8, Delete "W/L$_{(M51)}$," and insert -- W/L$_{(M151)}$, --

Column 14, Line 39: In Claim 10, Delete "diver" and insert -- driver --

Signed and Sealed this
Thirteenth Day of May, 2014

Michelle K. Lee
*Deputy Director of the United States Patent and Trademark Office*